United States Patent
Chen (10) Patent No.: US 11,670,505 B2
(45) Date of Patent: Jun. 6, 2023

(54) SEMICONDUCTOR SUBSTRATE, SEMICONDUCTOR DEVICE, AND METHOD FOR FORMING SEMICONDUCTOR STRUCTURE

(71) Applicant: Vanguard International Semiconductor Corporation, Hsinchu (TW)

(72) Inventor: Chih-Yen Chen, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 153 days.

(21) Appl. No.: 17/005,542

(22) Filed: Aug. 28, 2020

(65) Prior Publication Data

US 2022/0068631 A1    Mar. 3, 2022

(51) Int. Cl.
*H01L 21/02* (2006.01)
*H01L 29/66* (2006.01)
*H01L 29/778* (2006.01)
*H01L 29/20* (2006.01)
*H01L 29/205* (2006.01)

(52) U.S. Cl.
CPC ...... *H01L 21/0243* (2013.01); *H01L 21/0254* (2013.01); *H01L 21/02458* (2013.01); *H01L 21/02502* (2013.01); *H01L 21/02505* (2013.01); *H01L 29/66462* (2013.01); *H01L 29/7786* (2013.01); *H01L 21/0242* (2013.01); *H01L 21/02378* (2013.01); *H01L 21/02389* (2013.01); *H01L 21/02455* (2013.01); *H01L 21/02488* (2013.01); *H01L 21/02513* (2013.01); *H01L 29/2003* (2013.01); *H01L 29/205* (2013.01)

(58) Field of Classification Search
CPC .......... H01L 21/0243; H01L 21/02458; H01L 21/02502; H01L 21/02505; H01L 21/0254; H01L 29/66462; H01L 29/7786
See application file for complete search history.

(56) References Cited

U.S. PATENT DOCUMENTS

| | | | |
|---|---|---|---|
| 9,620,362 B2 * | 4/2017 | Chen | H01L 29/66462 |
| 10,453,947 B1 * | 10/2019 | Lin | H01L 21/304 |
| 2019/0371929 A1 * | 12/2019 | Odnoblyudov | H01L 29/157 |
| 2021/0273084 A1 * | 9/2021 | Chen | H01L 21/02381 |

* cited by examiner

*Primary Examiner* — Julia Slutsker
(74) *Attorney, Agent, or Firm* — Birch, Stewart, Kolasch & Birch, LLP (57) ABSTRACT

A semiconductor substrate is provided. The semiconductor substrate includes a ceramic base, a seed layer, and a nucleation layer. The ceramic base has a front surface and a back surface, and the front surface is a non-flat surface. The seed layer is disposed on the front surface of the ceramic substrate. The nucleation layer is disposed on the seed layer.

20 Claims, 8 Drawing Sheets

SEMICONDUCTOR SUBSTRATE, SEMICONDUCTOR DEVICE, AND METHOD FOR FORMING SEMICONDUCTOR STRUCTURE

BACKGROUND

Technical Field

The embodiment of the present disclosure relates to semiconductor techniques, and in particular it relates to a semiconductor structure having a seed layer and methods for forming the same.

Description of the Related Art

GaN-based semiconductor materials have many excellent material properties, such as high heat resistance, wide bandgaps, and high electron saturation rates. Therefore, GaN-based semiconductor materials are suitable for high-speed and high-temperature operating environments. In recent years, GaN-based semiconductor materials have been widely used in light-emitting diodes (LEDs) and high-frequency elements, such as high electron mobility transistors (HEMTs) having a heterojunction structure.

Although existing GaN-based high electron mobility transistors have generally been adequate for their intended purposes, they have not been entirely satisfactory in all respects. Therefore, how to manufacture semiconductor substrates efficiently and further improve the performance of the high electron mobility transistor is still one of the current research topics in the industry.

BRIEF SUMMARY OF THE DISCLOSURE

Some embodiments of the disclosure provide a semiconductor substrate. The semiconductor substrate includes a ceramic base having a front surface and a back surface, and the front surface is a non-flat surface. The semiconductor substrate also includes a seed layer disposed on the front surface of the ceramic base. The semiconductor substrate further includes a nucleation layer disposed on the seed layer.

Some embodiments of the disclosure provide a semiconductor device. The semiconductor device includes the above-described semiconductor substrate. The semiconductor device also includes a compound semiconductor layer disposed on the nucleation layer. The semiconductor device also includes a gate disposed on the compound semiconductor layer. The semiconductor device further includes a source and a drain disposed on the semiconductor layer and on opposite sides of the gate.

Some embodiments of the disclosure provide a method for forming a semiconductor structure. The method includes providing a ceramic base having a front surface and a back surface, and the front surface is a non-flat surface. The method also includes forming a seed layer on the front surface of the ceramic base. The method further includes forming a nucleation layer on the seed layer.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

A semiconductor structure of the present disclosure is illustrated below in detail. It should be noted that the following description provides many different embodiments, or examples, for implementing different aspects of some embodiments of the disclosure. Specific examples of components and arrangements described below are merely for describing some embodiments of the present disclosure briefly and clearly. These are, of course, merely examples and are not intended to be limiting. In addition, different embodiments may use like and/or corresponding numerals to denote like and/or corresponding elements in order to clearly describe the present disclosure. However, these like and/or corresponding numerals in different embodiments are merely used for clearly describing some embodiments of the present disclosure, and does not suggest any correlation between different embodiments.

The following disclosure provides many different embodiments, or examples, for implementing different features of the subject matter provided. If the formation of a first component on a second component is mentioned in the description, it may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "above," "below," "over," "under," and the like, encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the disclosure and the background or the context of the disclosure, and should not be interpreted in an idealized or overly formal manner unless so defined.

Although features in some described embodiments are described in certain order, these ways of describing may also be performed in other logical order. The semiconductor of the present disclosure may include other features. In various embodiments, some features may be replaced or omitted.

In accordance with some embodiments of the present disclosure, the semiconductor structure forms a GaN-based high electron mobility transistor directly on a ceramic base.

FIGS. 1A-1E illustrate cross-sectional views of various stages of the forming process of a semiconductor structure. In should be appreciated that additional operations may be provided before, during, and/or after performing the process of forming a semiconductor structure 100. In various embodiments, some of the described stages may be replaced or eliminated. Additional features may be added to the semiconductor structure 100. In various embodiments, partial features of the semiconductor structure 100 described below may be replaced or eliminated.

Figure 1A:
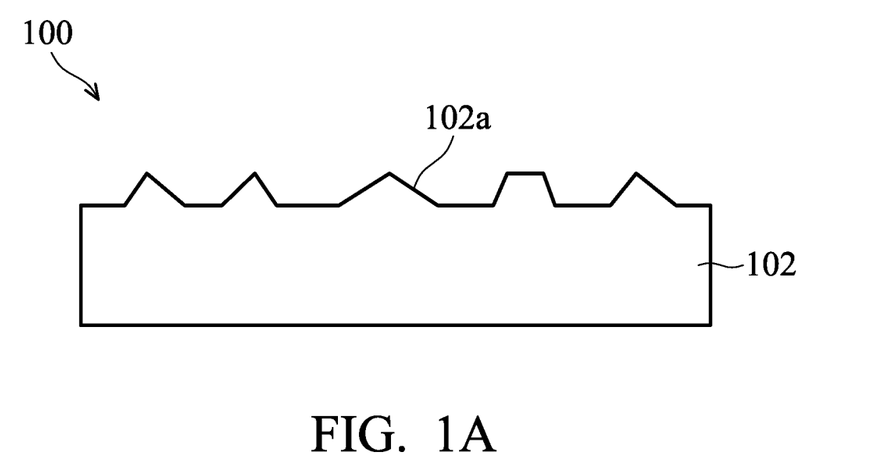
FIGS. 1A-1E illustrate intermediate stages of forming a semiconductor structure in accordance with some embodiments of the disclosure.

Referring to FIG. 1A, a ceramic base 102 is provided in the semiconductor structure 100. In the present disclosure, the ceramic base 102 refers to ceramic materials other than silicon, such as silicon carbide, aluminum nitride (AlN) or aluminum oxide. In some embodiments, the ceramic base 102 may be a polycrystalline material. In addition, the ceramic base 102 may be doped (for example, doped with a p-type or n-type dopant) or undoped. In accordance with some embodiments of the present disclosure, the ceramic base 102 is an amorphous or polycrystalline material. The ceramic base 102 includes a front surface and a back surface, wherein the front surface is the surface for forming devices. As shown in FIG. 1A, the front surface 102a of the ceramic base 102 is a non-flat surface. In some embodiments, there is a plurality of pits on the front surface 102a, wherein the sizes of the pits are usually between about 0.1 μm to 100 μm.

Figure 1B:
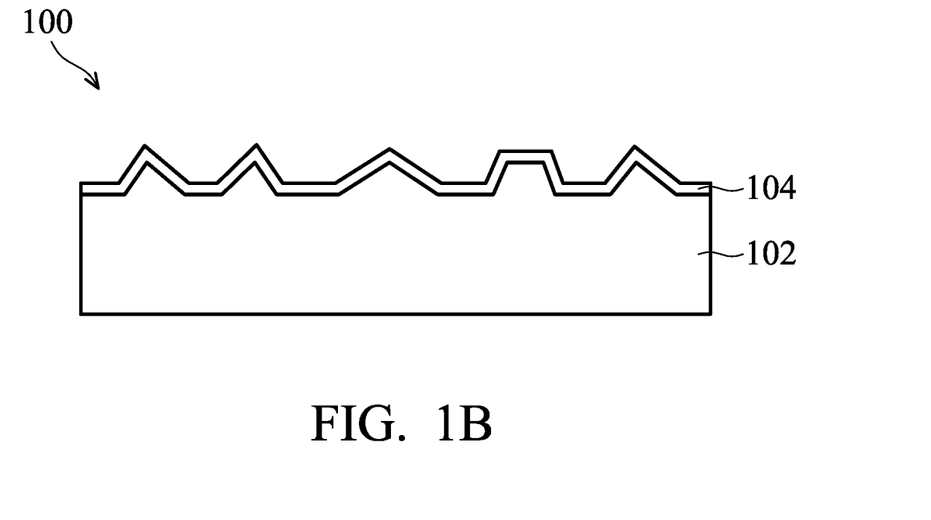

Referring to FIG. 1B, in accordance with some embodiments of the present disclosure, a seed layer 104 is directly formed on the unpolished front surface of the ceramic base 102, and the seed layer 104 is conformally formed on the non-flat front surface 102a of the ceramic base 102. The material of the seed layer 104 may include monocrystalline AlN, polycrystalline AlN, amorphous AlN, other suitable materials, or a combination thereof. In some embodiments, the seed layer 104 may be formed by an epitaxial growth process. The seed layer 104 may be formed conformally on the front surface of the ceramic base 102 and in the plurality of pits of the front surface, for example, by atomic layer deposition (ALD), metal organic chemical vapor deposition (MOCVD), hydride vapor phase epitaxy (HVPE), molecular beam epitaxy (MBE), other suitable methods, or a combination thereof. In addition, although the seed layer 104 fills in the pits conformally and partially in the embodiment shown in FIG. 1B, however in some other embodiments, the seed layer 104 may also fills in the pits completely.

In some embodiments, before forming the seed layer 104, a conductive layer (not shown) used for electrostatic chuck (E-chuck) may be formed on the back surface of the ceramic base 102. The conductive layer may include, for example, doped polysilicon, or other conductive materials. The conductive layer may be formed by, for example, low pressure chemical vapor deposition (LPCVD). According to some embodiments of the present disclosure, during the deposition process of the conductive layer, besides the back surface of the ceramic base 102, the conductive layer may also grow on the front surface and side surfaces of the ceramic base 102. The conductive layer on the front surface of the ceramic base 102 may be removed by an etching process to prevent it from affecting the deposition of the seed layer 104 or other subsequent layers above the front surface of the ceramic base 102.

Figure 1C:
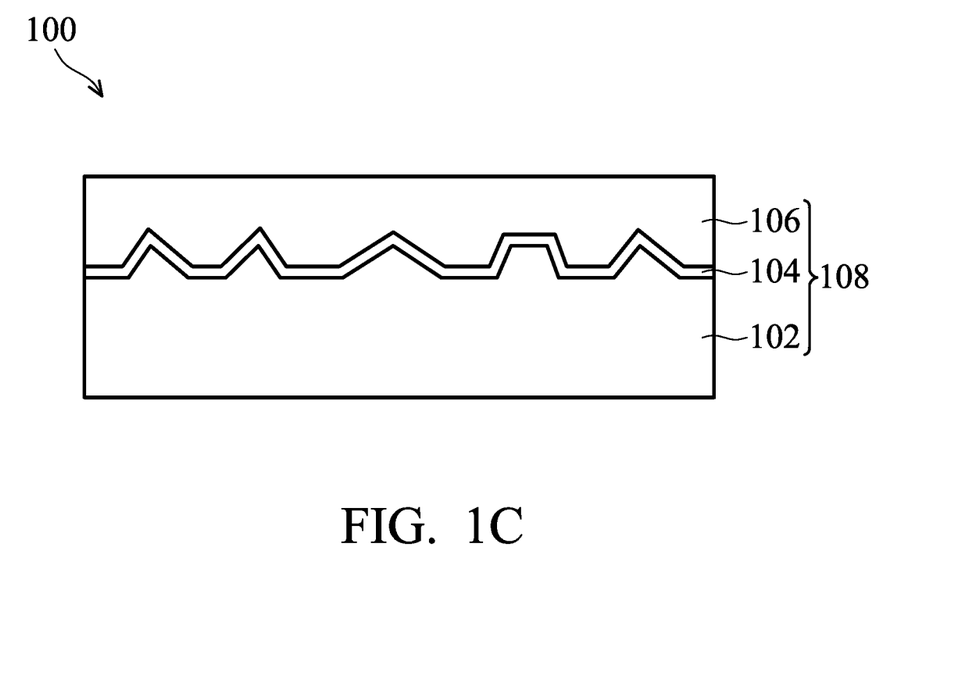

Then referring to FIG. 1C, in accordance with some embodiments of the present disclosure, a nucleation layer 106 is formed on the seed layer 104. The ceramic base 102, the seed layer 104, and the nucleation layer 106 may be collectively referred to as a semiconductor substrate 108. The nucleation layer 106 may be used to mitigate the lattice difference between the seed layer 104 and the buffer layer described below. At the same time, the nucleation layer 106 gradually transforms the crystalline phase from original amorphous or polycrystalline to polycrystalline or monocrystalline, thereby improving the crystalline quality. It is noted that the nucleation layer 106 may fills the pits which have not been completely filled, and have a substantially flat upper surface. In the present disclosure, a substantially flat upper surface means that the difference of thickness of the entire substrate is less than about 1 nm to 10 nm, such as about 2 nm to 5 nm. In some embodiments, the nucleation layer 106 is a III-V compound of aluminum. For example, the nucleation layer 106 may be formed with AlN, aluminum gallium nitride ($Al_xGa_{1-x}N$, $0<x<1$), GaN, other suitable materials, or a combination thereof. In some embodiments, the nucleation layer 106 may be deposited by metal organic chemical vapor deposition (MOCVD), hydride vapor phase epitaxy (HVPE), molecular beam epitaxy (MBE), other suitable methods, or a combination thereof.

Figure 1D:
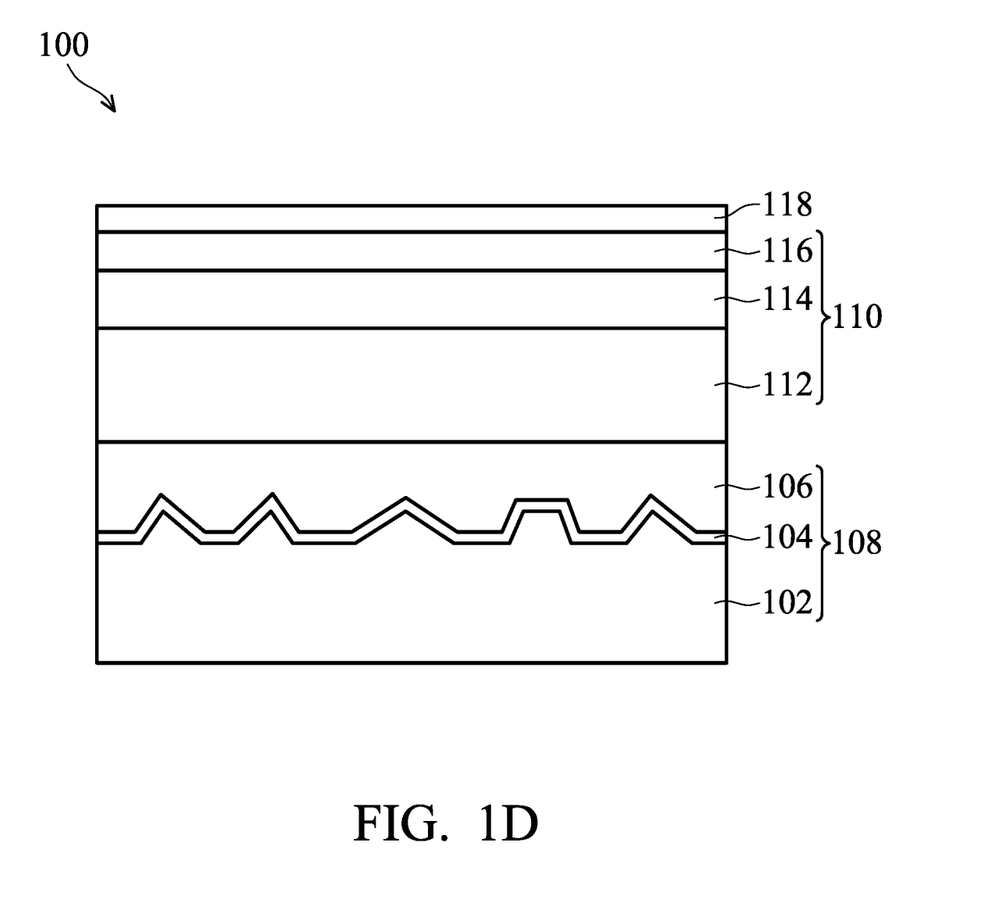

FIG. 1D is a cross-sectional view of forming a compound semiconductor layer 110 on the nucleation layer. In accordance with some embodiments, the compound semiconductor layer 110 is a GaN-based semiconductor layer. The compound semiconductor layer may include a buffer layer 112 disposed on the nucleation layer 106, a channel layer 114 on the buffer layer 112, and a barrier layer 116 on the channel layer 114.

In accordance with some embodiments, the buffer layer 112 may mitigate the strain of the channel layer 114, which is subsequently formed above the buffer layer 112, to prevent defects from forming in the overlying channel layer 114. The strain is caused by the mismatch between the structure of the channel layer 114 and the structure below the buffer layer 112. In some embodiments, the materials of the buffer layer 112 may include AlN, GaN, $Al_xGa_{1-x}N$ ($0<x<1$), other suitable materials, or a combination thereof. Moreover, the buffer layer 112 may be formed by an epitaxial deposition process, such as MOCVD process, HVPE process, MBE process, other suitable methods, or a combination thereof.

In some embodiments, the thickness of the formed buffer layer 112 may range from about 0.3 μm to about 30 μm, for example, about 5 μm, but the present disclosure is not limited to this. It should be understood that, although the buffer layer 112 in the embodiment illustrated in FIG. 1D is a single-layer structure, the buffer layer 112 may also have a multilayer structure in other embodiments.

Figure 1E:
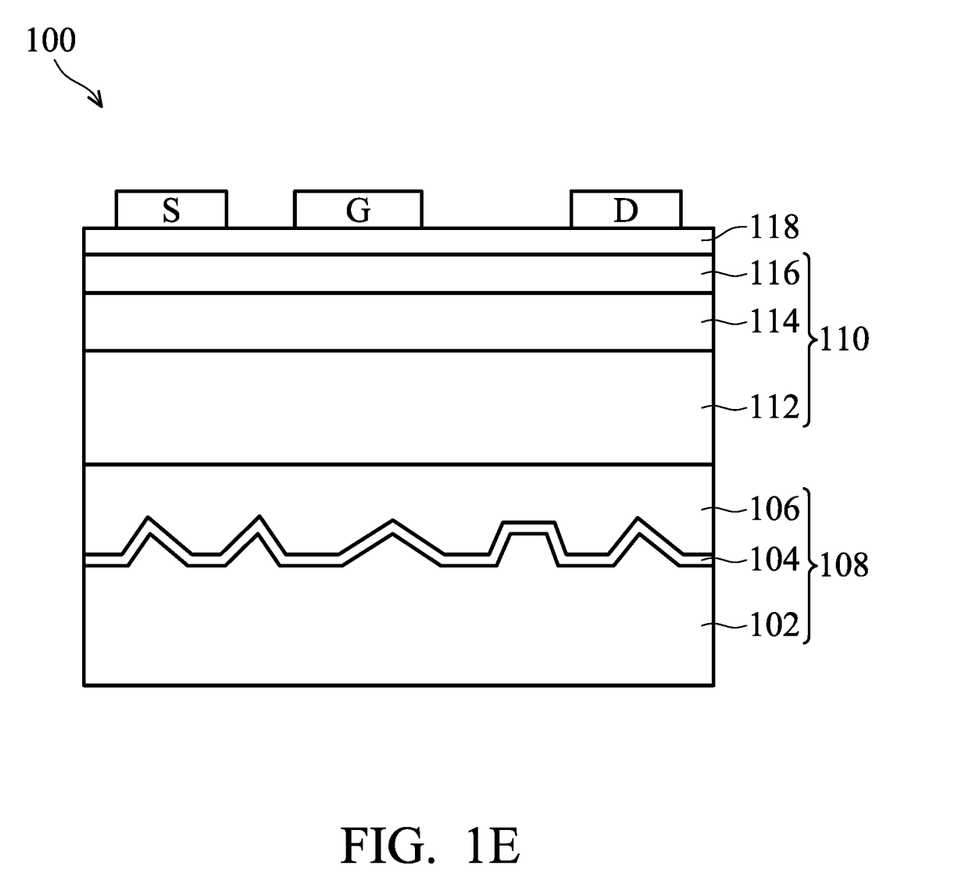

In addition, in some embodiments, two-dimensional electron gas (2DEG) (not shown) may be formed between the heterojunction between the channel layer 114 and the barrier layer 116. In accordance with some embodiments, the semiconductor structure 100 (as shown in FIG. 1E) is a high electron mobility transistor (HEMT) using two-dimensional electron gas (2DEG) as conductive carriers. In some embodiments, the channel layer 114 may be a GaN layer, and the barrier layer 116 formed on the channel layer 114 may be an $Al_xGa_{1-x}N$ (0<x<1) layer, wherein the GaN layer and the $Al_xGa_{1-x}N$ (0<x<1) layer may or may not contain dopants (for example, n-typed dopants or p-typed dopants). Moreover, the channel layer 114 and the barrier layer 116 may be formed by an epitaxial growth process, such as, MOCVD process, HVPE process, MBE process, other suitable methods, or a combination thereof.

In some embodiments, the thickness of the formed channel layer 114 may be between about 5 nm and about 500 nm, for example, 400 nm, but the present disclosure is not limited to this. In some embodiments, the thickness of the formed barrier layer 116 may be between about 5 nm and about 30 nm, for example, about 15 nm, but the present disclosure is not limited to this.

Still referring to FIG. 1D, in accordance with some embodiments, a cap layer 118 may be formed on the compound semiconductor layer. The cap layer 118 formed on the barrier layer 116 may be a III-V compound semiconductor material, used to passivate the surfaces of materials, to significantly suppress the current breakdown effect and reduce surface current leakage. The channel layer 114, barrier layer 116, and the cap layer 118 may all be formed by an epitaxial growth process, such as MOCVD, HVPE, MBE, combinations thereof or other similar methods. In some embodiments, the thickness of the formed cap layer 118 may be in the range of about 0.5 nm to about 10 nm, such as about 2 nm, but the present disclosure is not limited to this.

Then referring to FIG. 1E, a gate G may be formed on the cap layer 118, and a source S and a drain D may be formed on opposite sides of the gate G to form the semiconductor structure 100. In some embodiments, the materials of the gate G, source S, and the drain D may contain conductive materials, such as metal, metal silicide, other suitable conductive materials, or a combination thereof. For example, the metals may include gold (Au), nickel (Ni), platinum (Pt), palladium (Pd), iridium (Ir), titanium (Ti), chromium (Cr), tungsten (W), aluminum (Al), copper (Cu), alloys thereof, other suitable materials, or a combination thereof. In some embodiments, the gate G, source S, and the drain D may be formed on the cap layer 118 by chemical vapor deposition process, physical vapor deposition (PVD) process, evaporation process, sputtering process, other suitable processes, or a combination thereof. Then, the gate G, source S, and the drain D are formed through a patterning process. In some embodiments, the gate G, source S, and the drain D may be formed after the cap layer 118 is patterned. In this embodiment, the cap layer 118 is below the gate G only.

As mentioned above, a semiconductor device with a high electron mobility transistor (HEMT) formed on a ceramic substrate is formed, which includes sequentially depositing a seed layer and a nucleation layer directly on an unpolished ceramic substrate, and a high electron mobility transistor device is formed above. In comparative embodiments, when a semiconductor substrate includes a ceramic base and multiple dielectric layers (such as aluminum nitride (AlN), tetraethoxysilane (TEOS), SiN, PEOX, etc.), multiple thermal junctions may be formed between the multiple dielectric layers, which is disadvantageous to high electron mobility transistor elements under high power operation. In contrast, since the semiconductor substrate of the present disclosure omits the fabrication of multiple dielectric layers, it may not only prevent the formation of multiple thermal junctions, but may further shorten the fabrication time of the semiconductor substrate. In addition, GaN-on-Si may crack easily during the manufacturing process, which results in decreased overall yield, and increased cost. Therefore, the present disclosure may provide a semiconductor substrate with a ceramic base of 8 inches or more that does not crack, which is attractive to the industry.

FIGS. 2A-2F illustrate cross-sectional views of various stages of the forming process of a semiconductor structure in accordance with some alternative embodiments of the present disclosure. Different from the embodiments of forming a semiconductor structure in FIGS. 1A-1E, in the embodiments of FIGS. 2A-2F, a dielectric filler is first deposited on a front surface of a ceramic substrate to fill in pits, and then epitaxial layers are deposited. For simplicity of description, in subsequent embodiments, similar elements will be represented by the same numerals of the elements.

Figure 2A:
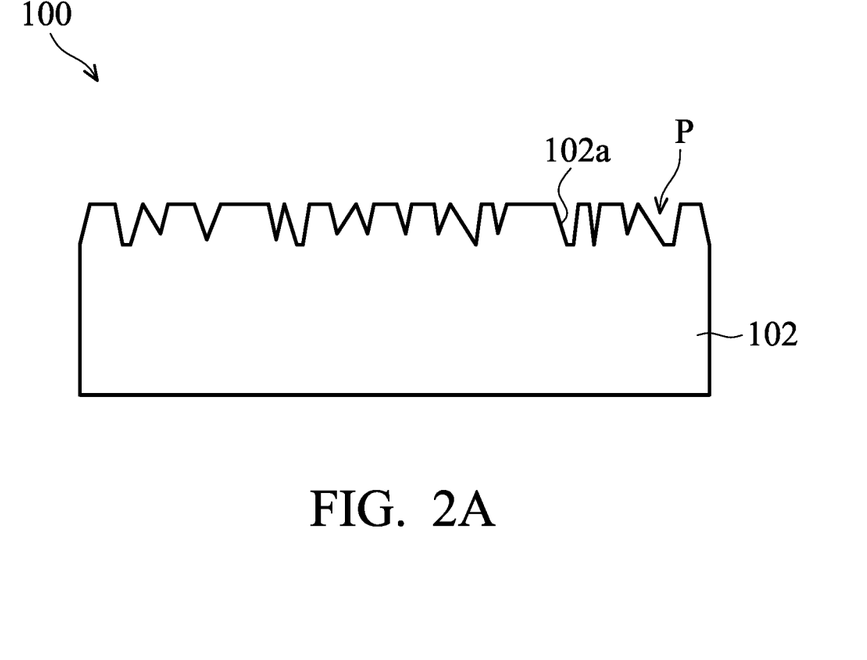
FIGS. 2A-2F illustrate intermediate stages of forming a semiconductor structure in accordance with some embodiments of the disclosure.

Referring to FIG. 2A, a ceramic base 102 is provided in a semiconductor structure 100. In the present disclosure, the ceramic base 102 refers to a ceramic material other than silicon, such as silicon carbide, aluminum nitride or aluminum oxide. In some embodiments, the ceramic base 102 doesn't comprise dielectric layer, such as silicon oxide, silicon nitride, silicon oxynitride, other suitable material or a combination thereof. In some embodiments, the ceramic base 102 may be a polycrystalline material. In addition, the ceramic base 102 may be doped (for example, doped with p-typed or n-typed dopants) or undoped. In accordance with some embodiments of the present disclosure, the surface of the ceramic base 102 is an amorphous or polycrystalline material. The ceramic base 102 includes a front surface and a back surface, wherein the front surface is the surface for forming devices. As shown in FIG. 2A, the front surface 102a of the ceramic base 102 is a non-flat surface. In some embodiments, there is a plurality of pits P on the front surface 102a. In some embodiments, a conductive layer (not shown) used for electrostatic chuck may be formed on the back surface of the ceramic base 102, wherein the materials and the forming method included may be similar to the aforementioned conductive layer.

Figure 2B:
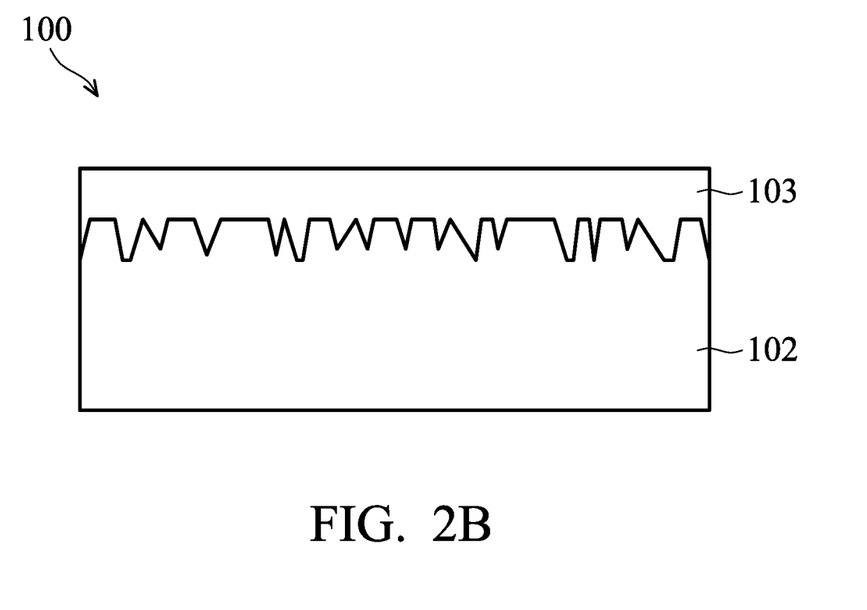

Referring to FIG. 2B, in accordance with some embodiments of the present disclosure, a dielectric filler 103 is formed on the front surface of the ceramic base 102, and the dielectric filler 103 fills in the pits on the front surface of the ceramic base 102. The materials of the dielectric filler 103 include borophosphosilicate glass (BPSG), borosilicate glass (BSG), phosphosilicate glass (PSG), tetraethoxysilane (TEOS) oxide, silicon oxide, silicon nitride, silicon oxynitride, low-k dielectric materials, other suitable materials, or a combination thereof. Low-k dielectric materials may include fluorinated silica glass (FSG), hydrogen silsesquioxane (HSQ), carbon doped silicon oxide, fluorinated carbon, parylene, bis-benzocyclobutenes (BCB) or polyimide. For example, in some embodiments, the dielectric filler 103 may be formed on the ceramic base 102 by spin coating process, chemical vapor deposition (CVD) process, atomic layer deposition (ALD) process, high density plasma CVD (HDPCVD) process, low pressure CVD (LPCVD), other suitable methods, or a combination thereof. As shown in FIG. 2B, the dielectric filler 103 may completely fill in the pits P on the ceramic base 102 in some embodiments.

Figure 2C:
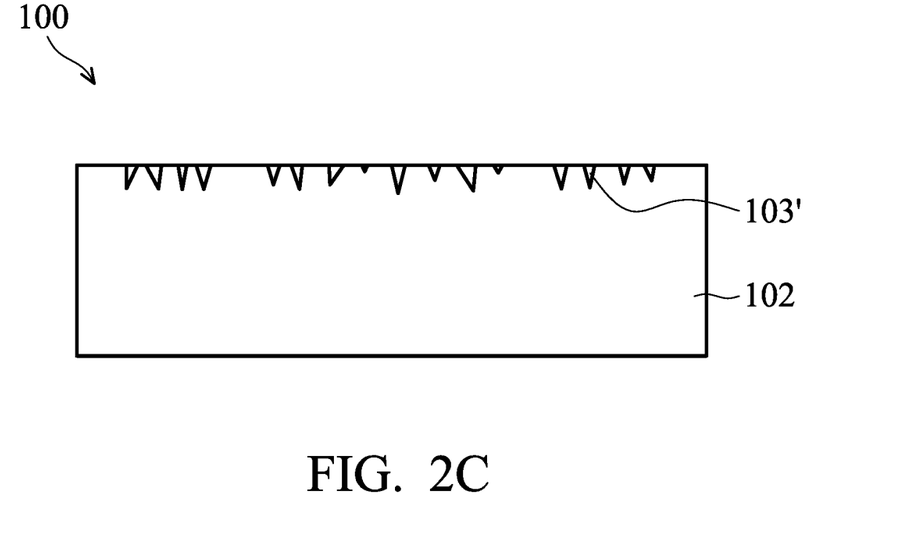

In accordance with some embodiments of the present disclosure, a planarization process is performed on the dielectric filler 103, such as chemical mechanical polishing (CMP), until the substrate exposes again to form a substantially flat front surface, as shown in FIG. 2C. The front surface after the planarization process may include a remained dielectric filler 103' and the ceramic base 102, wherein the remained dielectric filler 203' and the ceramic base 102 that exposes again are substantially coplanar.

Figure 2D:
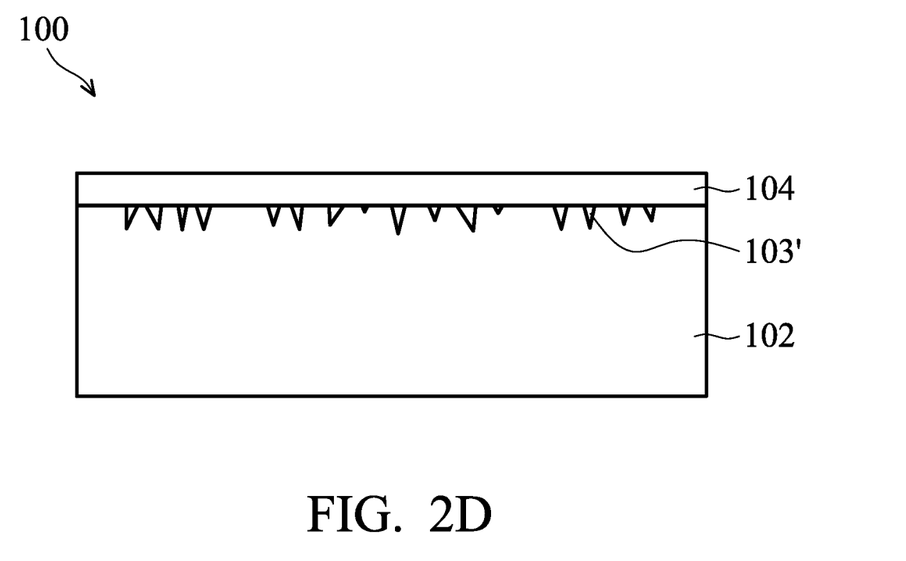

Then referring to FIG. 2D, in accordance with some embodiments of the present disclosure, a seed layer 104 is formed on the front surface composed of the remained dielectric filler 103' and the ceramic base 102. The material of the seed layer 104 may include monocrystalline AlN, polycrystalline AlN, amorphous AlN, other suitable materials, or a combination thereof. In some embodiments, the seed layer 104 may be formed by an epitaxial deposition process, for example, the seed layer 104 having a substantially flat upper surface may be formed by atomic layer deposition (ALD), metal organic chemical vapor deposition (MOCVD) process, hydride vapor phase epitaxy (HVPE) process, molecular beam epitaxy (MBE) process, other suitable methods, or a combination thereof.

Figure 2E:
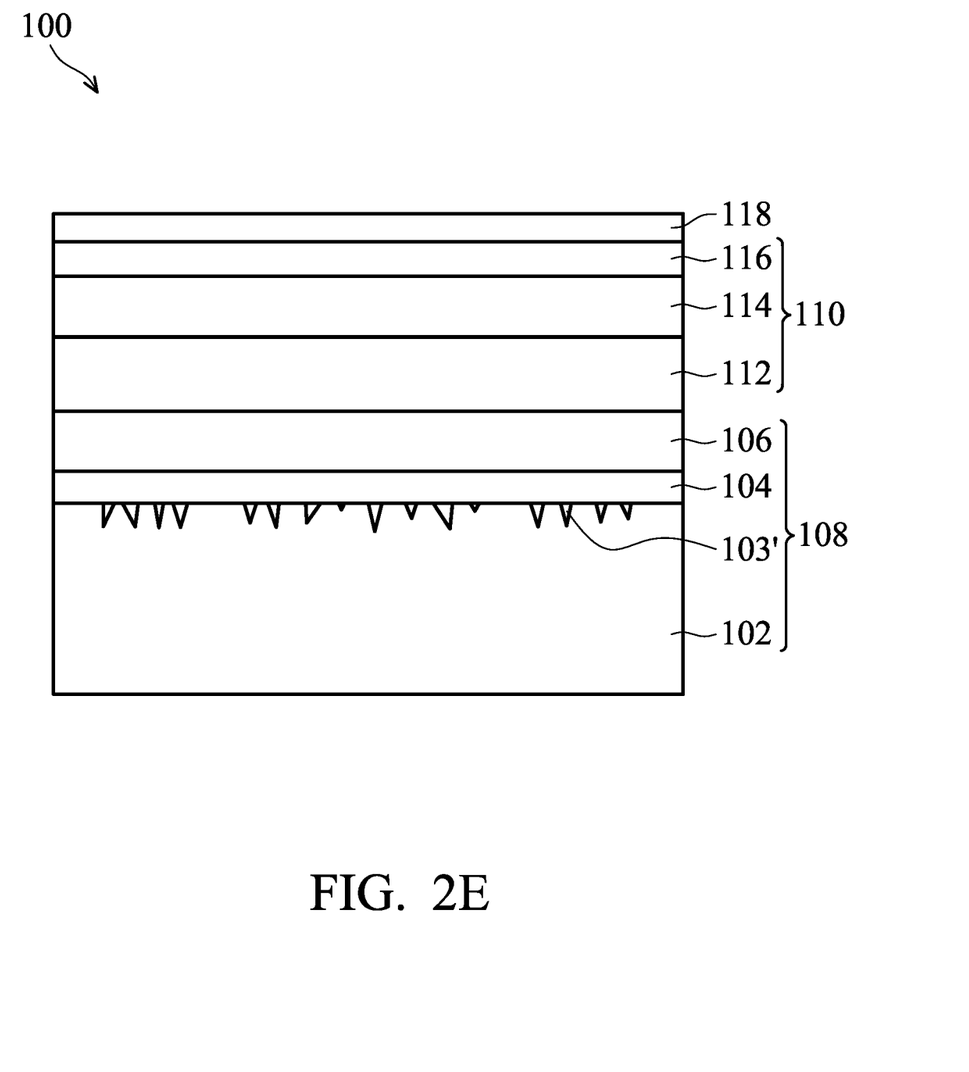

Referring to FIG. 2E, FIG. 2E is a cross-sectional view of forming a nucleation layer 106 on the seed layer 104 in accordance with some embodiments of the present disclosure. The ceramic base 102, the remained dielectric filler 103', the seed layer 104, and the nucleation layer 106 may be collectively referred to as a semiconductor substrate 108. Then a compound semiconductor layer 110 is formed on the nucleation layer, wherein the compound semiconductor layer may include the buffer layer 112 disposed on the nucleation layer 106, the channel layer 114 on the buffer layer 112, and the barrier layer 116 on the channel layer 114. Then according to some embodiments, a cap layer 118 may be formed on the compound semiconductor layer. The materials and the forming methods of the respective layers of the compound semiconductor layer 110 and the cap layer 118 are the same as or similar to embodiments where the dielectric filler 103' is not included in the semiconductor structure 100.

Figure 2F:
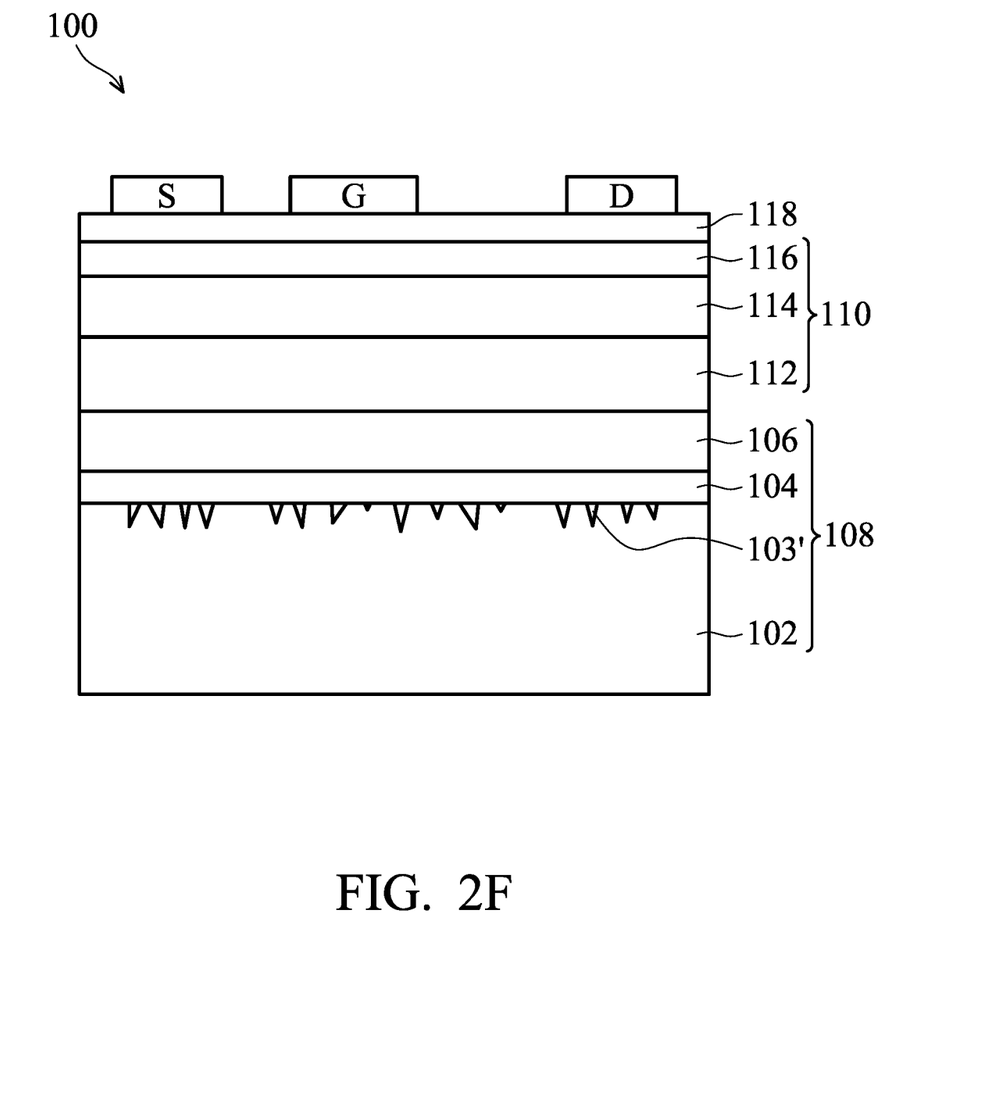

Then referring to FIG. 2F, a gate G may be formed on the cap layer 118, and a source S and a drain D may be formed on opposite sides of the gate G to form a semiconductor structure 100. The materials and the forming methods included in the gate G, source S, and the drain D are the same as or similar to the embodiments where the dielectric filler 103' is not included in the semiconductor structure 100.

As mentioned above, this embodiment also forms a semiconductor device with a high electron mobility transistor (HEMT) formed on a ceramic substrate, which includes sequentially depositing a dielectric filler, a seed layer, and a nucleation layer as filling materials on the ceramic substrate, and a HEMT device is formed above. Compared with the time needed (e.g. 21 days) to form multiple dielectric layers on a ceramic base in comparative embodiments, this embodiment may also shorten the fabrication time of the substrate to, such as 2 days. Compared to embodiments where a seed layer is directly formed, large-sized pits (e.g. pits larger than 10 μm) may be filled more effectively.

In summary, the present disclosure provides a semiconductor structure. By conformally depositing a seed layer on the upper surface of a ceramic base and its plurality of pits, a high electron mobility transistor (HEMT) may be formed directly on a ceramic substrate. Alternatively, in other embodiments, a semiconductor structure may be provided by first depositing a dielectric filler to fill in pits on the ceramic base, followed by depositing a seed layer. A GaN-based HEMT may be formed directly on the ceramic substrate. As such, the fabrication time of the HEMT device may be shortened, and the thermal mismatch and the lattice mismatch between the substrate and subsequently formed elements may be greatly reduced. The above description is only one of the purposes of the present disclosure and it is not intended to limit the scope of present disclosure.

Although some embodiments of the disclosure and their advantages have been described above, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the disclosure. Moreover, the scope of the present application is not intended to be limited to the particular embodiments of the process, machine, manufacture, composition of matter, means, methods and steps described in the specification. As a person having ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim forms a respective embodiment, and the scope of the disclosure also encompasses every claim and the combination thereof. The features among various embodiments may be mixed and used as long as they do not violate the spirit of the invention or conflict with each other.

What is claimed is:

1. A semiconductor substrate, comprising:
a ceramic base having a front surface and a back surface, and the front surface is a non-flat surface;
a seed layer at least partially directly disposed on the front surface of the ceramic base; and
a nucleation layer disposed on the seed layer,
wherein a material of the ceramic base and the seed layer comprises aluminum nitride.

2. The semiconductor substrate of claim 1, wherein the seed layer is conformally disposed on the non-flat surface.

3. The semiconductor substrate of claim 2, wherein the nucleation layer has a substantially flat upper surface.

4. The semiconductor substrate of claim 1, wherein the seed layer has a substantially flat upper surface.

5. The semiconductor substrate of claim 4, further comprising a dielectric filler under the seed layer, and the dielectric filler fills in pits on the front surface of the ceramic base.

6. The semiconductor substrate of claim 5, wherein the dielectric filler comprises borophosphosilicate glass (BPSG), borosilicate glass (BSG), phosphosilicate glass (PSG), tetraethoxysilane (TEOS) oxide, silicon dioxide, silicon nitride, silicon oxynitride, or a combination thereof.

7. The semiconductor substrate of claim 1, wherein the seed layer is monocrystalline or polycrystalline aluminum nitride.

8. The semiconductor substrate of claim 1, wherein a material of the nucleation layer is a III-V compound of aluminum.

9. A semiconductor device, comprising:
the semiconductor substrate of claim 1;
a compound semiconductor layer disposed on the nucleation layer;
a gate disposed on the compound semiconductor layer; and
a source and a drain disposed on the semiconductor layer and on opposite sides of the gate.

10. The semiconductor device of claim 9, wherein the compound semiconductor layer comprises:
a buffer layer disposed on the nucleation layer;
a channel layer disposed on the buffer layer; and
a barrier layer disposed on the channel layer.

11. A method for forming the semiconductor structure as set forth in claim 1, comprising:
providing a ceramic base having a front surface and a back surface, and the front surface is a non-flat surface;
forming a seed layer at least partially directly on the front surface of the ceramic base; and
forming a nucleation layer on the seed layer,
wherein a material of the ceramic base and the seed layer comprises aluminum nitride.

12. The method of claim 11, wherein the seed layer is conformally deposited on the non-flat surface.

13. The method of claim 12, wherein the nucleation layer has a substantially flat upper surface.

14. The method of claim 11, further comprising, before forming the seed layer,
depositing a dielectric filler, filling in pits of the front surface of the ceramic base; and
performing a planarization process, such that the dielectric filler is substantially coplanar with the ceramic base.

15. The method of claim 14, wherein the dielectric filler is formed of borophosphosilicate glass, borosilicate glass, phosphosilicate glass, tetraethoxysilane oxide, silicon oxide, silicon nitride, silicon oxynitride, or a combination thereof.

16. The method of claim 14, wherein the seed layer has a substantially flat upper surface.

17. The method of claim 11, wherein the seed layer is formed by atomic layer deposition, metal organic chemical vapor deposition, or hydride vapor deposition.

18. The method of claim 11, further comprising:
forming a compound semiconductor layer on the nucleation layer; and
forming a high electron mobility transistor device on the compound semiconductor layer.

19. The method of claim 11, further comprising depositing a polycrystalline Si-doped material on the back surface of the ceramic base.

20. The semiconductor substrate of claim 1, wherein there is a plurality of pits on the front surface, and the nucleation layer fills in the pits partially.

* * * * *